(12) United States Patent
Ku

(10) Patent No.: US 6,910,155 B2
(45) Date of Patent: Jun. 21, 2005

(54) SYSTEM AND METHOD FOR CHIP TESTING

(75) Inventor: Joseph Weiyeh Ku, Palo Alto, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 451 days.

(21) Appl. No.: 09/892,291

(22) Filed: Jun. 25, 2001

(65) Prior Publication Data

US 2002/0199136 A1 Dec. 26, 2002

(51) Int. Cl.[7] ................................................. G06F 11/27
(52) U.S. Cl. ........................ 714/30; 714/7; 714/57; 714/719; 714/723; 714/733
(58) Field of Search ................................ 714/7, 30, 719, 714/733, 723, 57

(56) References Cited

U.S. PATENT DOCUMENTS

| | | | | |
|---|---|---|---|---|
| 4,586,178 A | * | 4/1986 | Bosse | 714/711 |
| 5,633,877 A | * | 5/1997 | Shephard et al. | 714/733 |
| 5,912,901 A | * | 6/1999 | Adams et al. | 714/733 |
| 6,400,173 B1 | * | 6/2002 | Shimizu et al. | 324/765 |
| 6,408,401 B1 | * | 6/2002 | Bhavsar et al. | 714/7 |
| 6,499,119 B1 | * | 12/2002 | Orita et al. | 714/719 |
| 6,643,807 B1 | * | 11/2003 | Heaslip et al. | 714/719 |
| 6,704,895 B1 | * | 3/2004 | Swoboda et al. | 714/30 |

* cited by examiner

Primary Examiner—Scott Baderman
Assistant Examiner—Joseph D Manoskey
(74) Attorney, Agent, or Firm—Lloyd E. Dakin, Jr.

(57) ABSTRACT

A system and method for chip testing is disclosed. The present invention's method includes the steps of establishing a communications link between a chip and a computer tester; receiving on the chip an initial test algorithm over a communications link; testing the chip, using a built-in self-test (BIST) circuit on the chip, in accordance with the initial algorithm; collecting a set of failure information in response to testing; and transmitting the failure information from the chip to the computer over the communications link. The present invention's system includes: a communications link; a computer, operating a set of chip testing software; and a chip under test coupled to the computer by the communications link, having, a memory array; and a BIST module for testing the memory array in response to test algorithms received from the computer and transmitting those addresses within the memory array which failed testing.

31 Claims, 4 Drawing Sheets

| FIELD: | DATA CONTENTS: |
|---|---|
| A | HEADER |
| B | FAILED ADDRESS LENGTH |
| C | FAILED ADDRESS |
| D | FAILED DATA LENGTH |
| E | DATA WRITTEN |
| F | DATA READ-OUT |
| G | FAILED BIT LOCATIONS |

SYSTEM AND METHOD FOR CHIP TESTING

BACKGROUND OF THE INVENTION

1. Field of the Invention

The present invention relates generally to systems and methods for testing silicon wafers, and more particularly for chip testing.

2. Discussion of Background Art

Currently there are two major types of silicon chip testers: logic testers and memory testers. Both types of testers include very specialized routines for performing high throughput chip testing. However, chip testing has become much more complex with the advent and popularity of modem System On a Chip (SOC) designs. SOC designs incorporate both logic and memory circuitry. Since memory testers are not capable of testing logical circuitry, manufactures have been forces to use logic testers for testing the SOCs. Unfortunately, since logic testers were never intended to test chips with large memory arrays, test routines within the logic testers have become awkwardly complex as test engineers have tried to program them to test such memory arrays. Such barriers often discourage some SOC designers and manufacturers from incorporating embedded memory, such as DRAM into their designs in order to keep costs down, even though embedding DRAM into the design would have otherwise resulted in a significantly higher chip performance.

In an attempt to address these problems, some manufacturers have added Built-In-Self-Test (BIST) circuits to their chip designs. While BIST circuits enable the chip to perform testing on itself, the silicon resources necessary to build these BIST circuits on the chip adds significant complexity to the chip and taking away silicon resources that could otherwise have been reallocated. Furthermore, most BIST circuits only generate and transmit out a pass/fail signal which by itself provides no detailed information which could enable these manufacturers to repair the chip, by such techniques as redundancy allocation, without again performing a conventional logic and/or memory array test with a logic tester as described above. Redundancy allocation is a process of repairing failed on-chip circuits using a system of redundant on-chip circuitry and fusible links.

Other BIST circuits, such as the one described in U.S. Pat. No. 6,230,290, assigned to IBM Corporation, etch a ROM and complicated BIST circuitry on the chip. The ROM contains a fixed micro-code, however, has several limitations. First the micro-code can not be modified once burned in ROM. Second, the micro-code executed test routines are rigid and un-modifiable. Third, the ROM and BIST circuitry together are almost equivalent to a second CPU/SOC design in themselves, which requires a significant customized design effort in itself, as well as significant silicon resources.

Some other BIST circuits, which fall into one of the two categories above, are described in "A configurable DRAM macro design for 2112 derivative organizations to be synthesized using a memory generator," by T. Yabe et al., in ISSCC digest technical paper, February 1998, pp. 72–73; "An ASIC library granulate DRAM macro with built-in self test," by J. Dreibelbis et al., in ISSCC digest technical papers, February 1998, pp 74–75; and "An embedded DRAM Hybrid Macro with Auto Signal management and Enhanced-on-chip tester," by N. Watanabe et al, in ISSCC digest technical papers, February, 2001, pp 388–389.

Also, since memory defects are very much foundry sensitive, none of the above described BIST algorithms can be universally applied to a large number of logic and/or memory chips, which each currently require unique, customized, and rigid conventional memory testing. Standardized BIST ROMs or circuits simply can not be designed to affect all the different test algorithms which each separate foundry requires.

Thus, well known and laborious "direct memory testing" techniques, which use a large numbers of pads and associated complex pad multiplexing functions, have largely remained as the only way to perform embedded memory testing, especially for embedded DRAM. Such testing is however, very costly in terms of testing time and capital equipment expense.

In response to the concerns discussed above, what is needed is a system and method for chip testing that overcomes the problems of the prior art.

SUMMARY OF THE INVENTION

The present invention is a system and method for chip testing. The method of the present invention includes the steps of establishing a communications link between a chip and a computer tester; receiving on the chip an initial test algorithm over a communications link; testing the chip, using a built-in self-test circuit (BIST) on the chip, in accordance with the initial test algorithm; collecting a set of failure information in response to the testing; and transmitting the failure information from the chip to the computer over the communications link.

In other aspects of the invention, the method may include the steps of: receiving a second test algorithm whose coverage differs from the initial test algorithm, and testing the chip in accordance with the second test algorithm; testing a memory array within the chip; adding which address under test failed to a set of failed address information; generating a bit-map on the computer, from the failed address information, of failed bit locations within the memory array; repairing the chip using redundancy allocation techniques based on the set of failure information.

The present invention also includes a preferred data structure including a failed address field, and a failed bit locations field, and may also include a header field, a failed address length field, a failed data length field, a data written field, and a data read-out field.

The system of the present invention, includes: a communications link; a computer, operating a set of chip testing software; and a chip under test coupled to the computer by the communications link, having, a memory array; and a Built In Self Test (BIST) module for testing the memory array in response to test algorithms received from the computer and transmitting those addresses within the memory array which failed testing.

The system and method of the present invention are particularly advantageous over the prior art because an innovative and universal BIST circuit is designed to be completely configurable and to transmit detailed failure information off-chip, under command of a simple and inexpensive personal computer (PC). Thus the present invention replaces very expensive and difficult to use logic testing devices, and is particularly useful when testing system on a chip designs.

These and other aspects of the invention will be recognized by those skilled in the art upon review of the detailed description, drawings, and claims set forth below.

DETAILED DESCRIPTION OF THE PREFERRED EMBODIMENT

Figure 1:
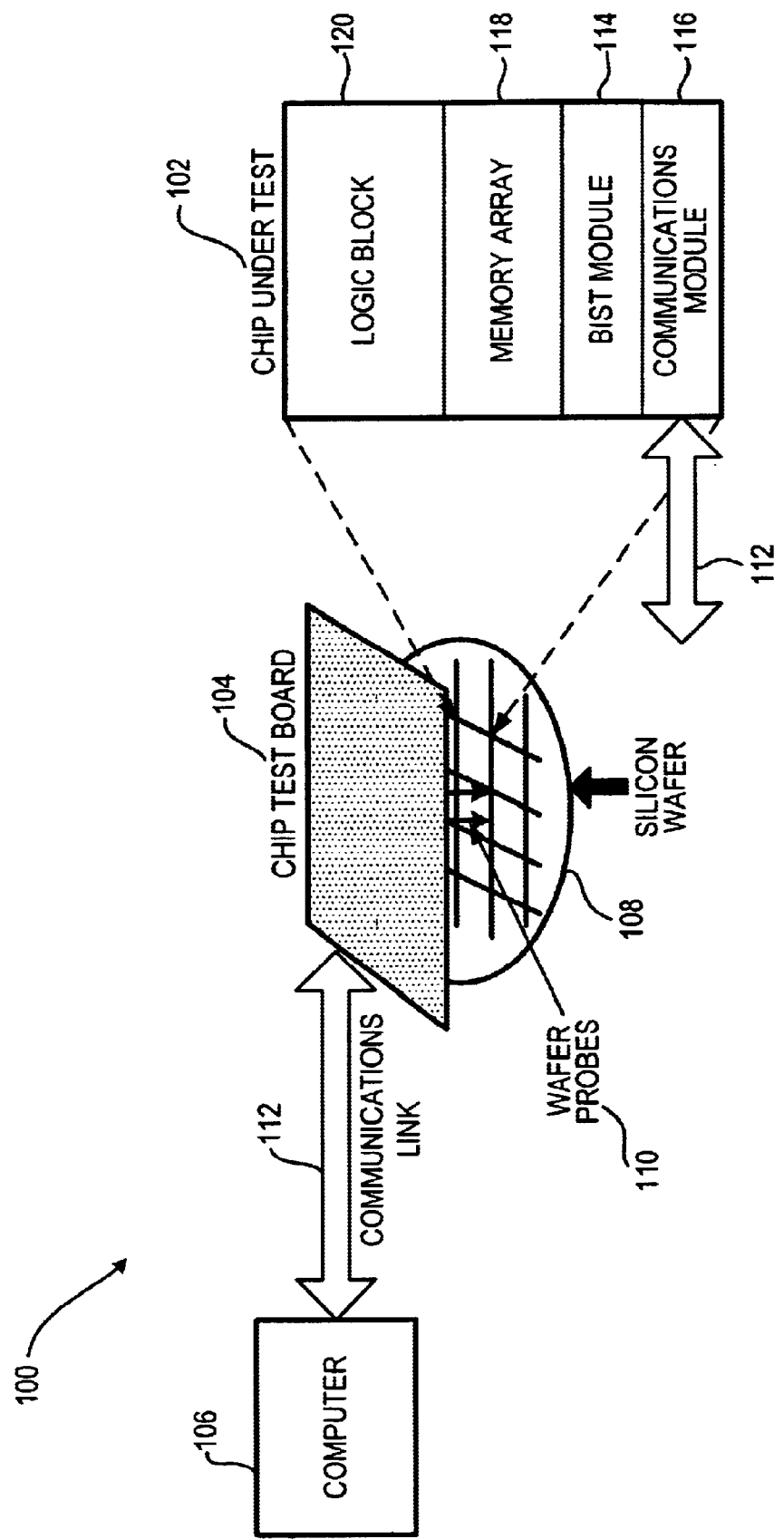
FIG. 1 is a block diagram of an embodiment of a system for testing an embedded memory array.

FIG. 1 is a block diagram of an embodiment of a system 100 for testing an embedded memory array. The system 100 includes a chip under test 102, a chip test board 104 and a computer tester 106. The chip 102 is an integrated circuit preferably tested while still a part of an intact silicon wafer 108 and is in communication with the test board 104 through conventional wafer probes 110. The computer 106 is preferably a conventional computer operating a set of chip testing software, but in an alternative embodiment, can be replaced by a logic tester. The chip 102 and computer 106 exchange messages via a communications link 112. The communication link 112 is preferably passes the messages according to one of several conventional serial bus protocols, such as JTAG (IEEE 1149.1), RS-232, 12C, SMBus, Universal Serial Bus (USB) 1.1 or 2.0, Firewire (IEEE 1394), or others. The message is preferably sent serially so as to minimize chip complexity and thus minimize chip costs. Those skilled in the art however recognize other message formats and protocols could alternatively be used.

The chip under test 102 includes a Built In Self Test (BIST) module 114, a communications module 116, a memory array 118, and a logic block 120. The BIST module 114 performs testing on the memory array 118. The communications module 116 receives test and memory array repair commands from the computer 106 and transmits test results to the computer 106 over the communications link 112. The memory array 118 can be of any type and may include redundant and/or repairable memory address. The logic block 120 includes conventional control circuitry for accessing the memory array 118.

Figure 2:
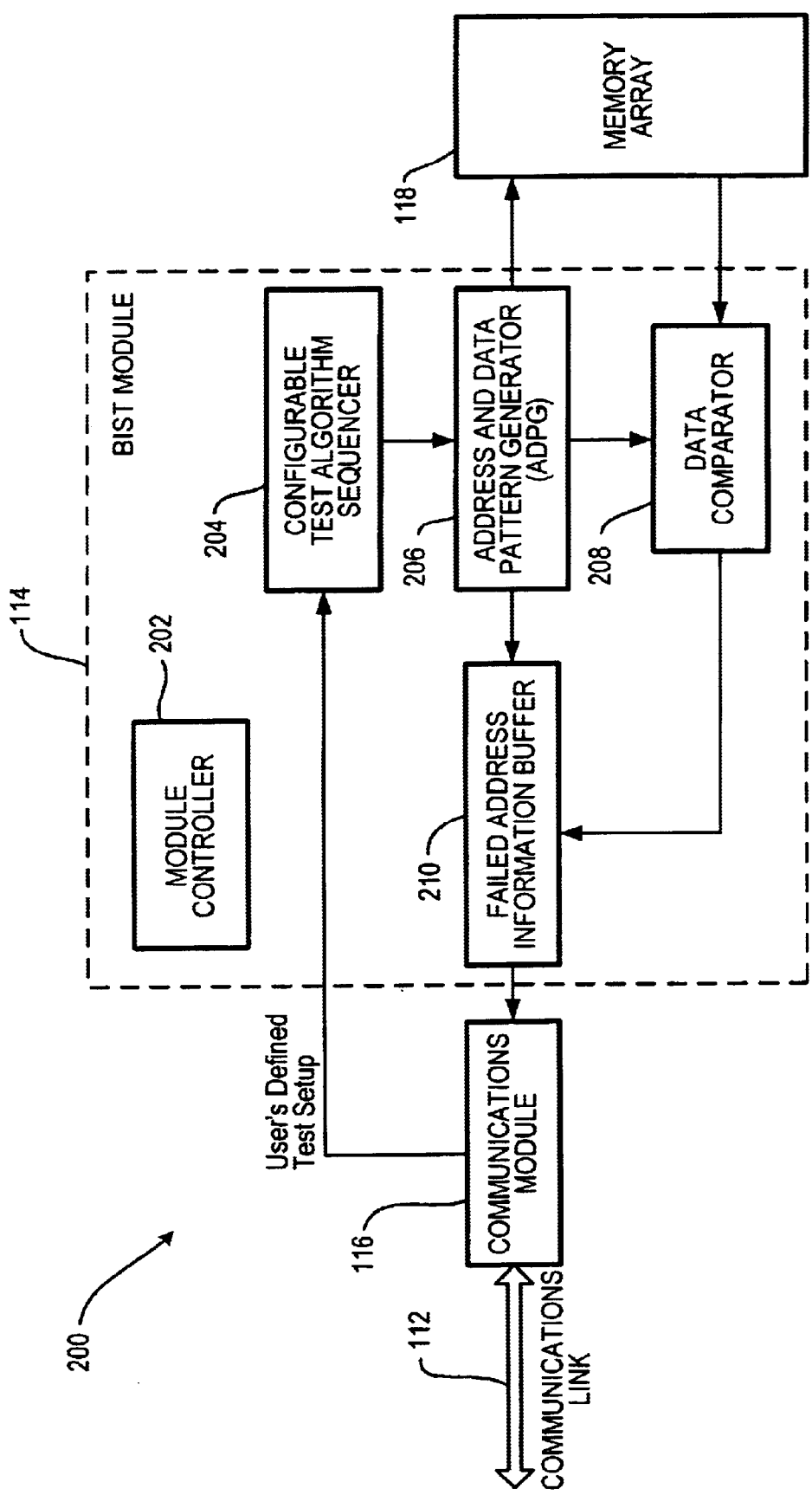
FIG. 2 is a functional diagram of a built-in self-test module within the system.
Figure 3:
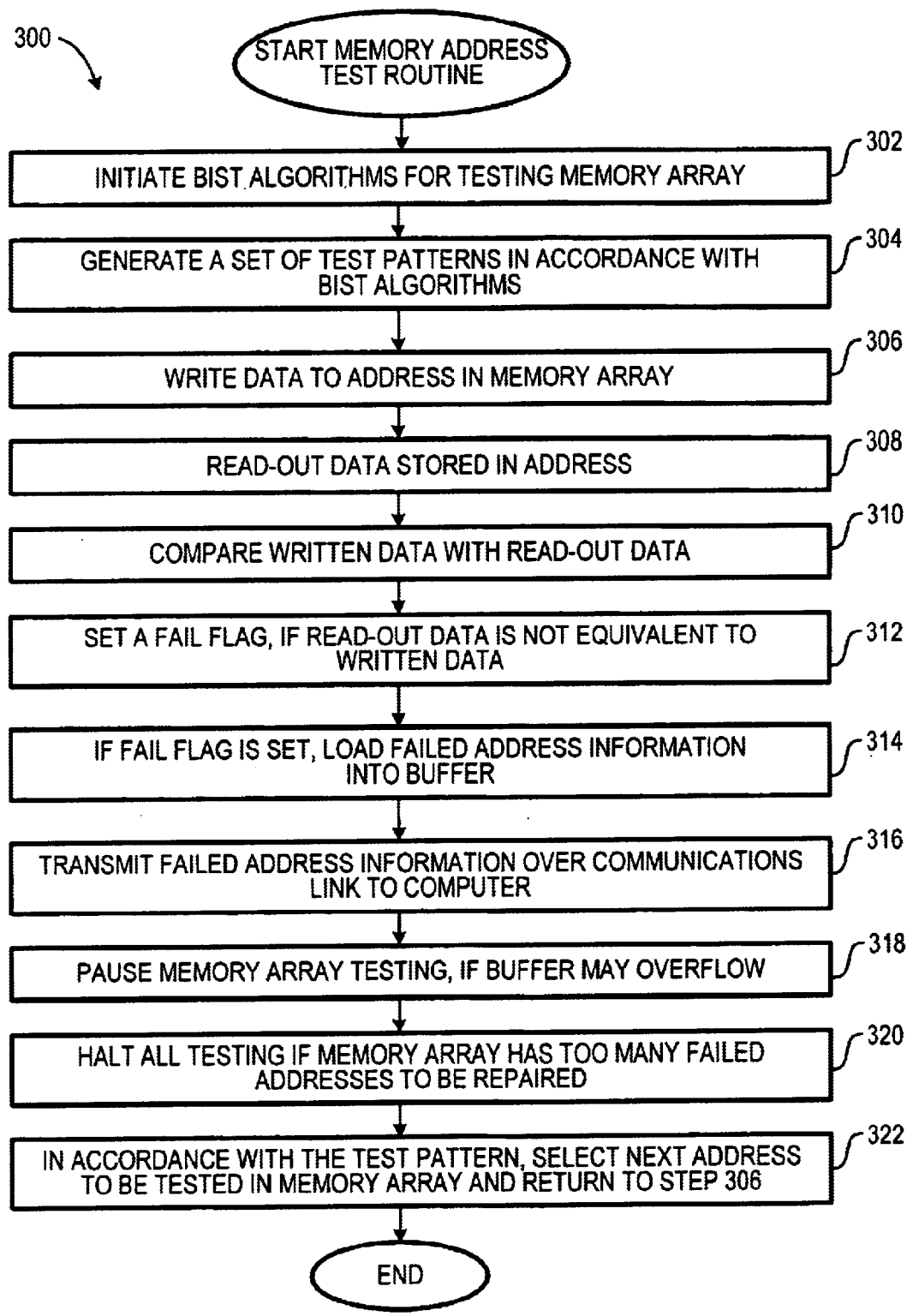
FIG. 3 is a flowchart of a method for testing memory addresses within the memory array.

FIG. 2 is a functional diagram 200 of the BIST module 114 within the system 100, and FIG. 3 is a flowchart of a method 300 for testing memory addresses within the memory array 118. FIGS. 2 and 3 are both discussed together. The BIST module 114 includes a module controller 202, a configurable test algorithm sequencer 204, an Address and Data Pattern Generator (ADPG) 206, an output data comparator 208, and a failed address information buffer 210. The controller 202 provides necessary overhead signaling necessary to operate the BIST module 114. The BIST module 114 may also include various simple address counters and control switches. Overall, the BIST module 114 is intended to be a universal circuit which can be embedded within any logic chip, memory array, SOC, or other device, and independent of which foundry and/or production line manufactures the chip 102.

The algorithm sequencer 204 preferably contains a set of built-in or default test algorithms which are automatically activated when power is applied to the chip 102, in step 302. After these built-in or default algorithms have executed, the sequencer 204 can receive additional algorithm set-up information and/or control codes transmitted over the communications link 112 from the computer 106. The set-up information and/or codes enables the BIST 114 to vary test coverage by uniquely reconfiguring the test algorithms depending upon whether a logic chip, a memory array, a SOC, or any other device under test, and based on the foundry or production line of the chip 102. The test algorithms can be set-up in either in a default sequence or as a set of discrete tests.

In step 304, the ADPG 206 generates a set of test patterns/vectors in accordance with the algorithms operating within the sequencer 204. The test patterns specify sets of data to be written to addresses within the memory array 118.

Actual testing of the memory array 118 begins in step 306, when the ADPG 206 writes a set of data to an address in the memory array 118. The ADPG 206 also transmits the set of written data and the address to the output comparator 208. Actual testing is dependent upon the memory array's 118 architecture (e.g. SDRAM, SRAM, etc.) and the test setup (e.g. write-read-read, or all write-all read).

In step 308, the comparator 208 reads-out data stored in the address of the memory array 118. Next in step 310, the comparator 208, in response to a strobe signal from the ADPG 206, compares the written data with the read-out data. The controller 202 sets a fail flag, in step 312, if the read-out data is not equivalent to the written data.

In step 314, if the fail flag is set, a set of failed address information is loaded into the buffer 210. The failed address information includes the address which failed testing, the written data, the read-out data, and those bit locations within the address which failed. The failed address information is provided by the ADPG 206 and the comparator 208. The buffer 210 temporarily holds the failed address information until copied by the communications module 116.

In step 316, the communications module 116 copies and transmits the failed address information to the computer 106. If the communications module 116 can not be driven at a sufficiently faster clock speed than the BIST module 114 and the buffer 210 may overflow, the controller 202 can set a test_hold signal, in step 318, which pauses testing of the memory array 118 and permits the communications module 116 to empty the buffer 210. Such an overflow situation can arise if a number of cumulative failed addresses exceeds the communications module's 116 ability to transmit the failed address information to the computer 106.

To minimize data transmitted over the communications link 112, only the address which failed testing, and those bit locations within the address which failed, need be sent to the computer 106 in order to perform basic yield analysis. Data transmitted over the link 112 can also be minimized by comparing subsequent failed data patterns in the buffer 210 with previous failed data patterns, and if equivalent the failed data patterns need not be retransmitted to the computer 106, so that there will be no repeated ones inside the buffer 210.

During initial prototype testing of the chip 102, testing of the chip 102 continues regardless of a number of failed addresses detected so that a bitmap can be re-constructed for a failure/yield analysis. However, during high production run manufacturing of the chip 102, the buffer's 210 size is preferably set equal to a number of address redundancies within the chip 102, so that, in step 320, if more than the number of memory address failures are detected, the controller 202 halts all testing and sets a flag which informs the computer 106 that the memory array 118 has too many failed addresses to be repaired. In such a situation, the chip 102 has more failed addresses than can be repaired.

Figure 4:
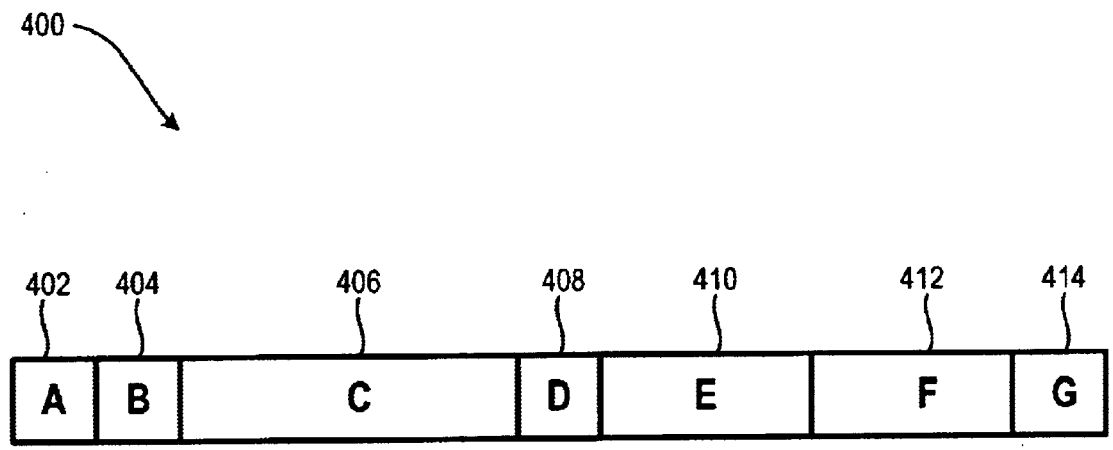
FIG. 4 is a data structure for transmitting failed memory information over a communications link to a computer for analysis.

FIG. 4 is a data structure 400 for transmitting the failed memory information over the communications link 112 to the computer 106. The data structure 400 includes a header field 402, a failed address length field 404, a failed address field 406, a failed data length field 408, a data written field 410, a data read-out field 412, and a failed bit locations field 414. As mentioned above, the data written field 410 and the data read-out field 412 need not necessarily be transmitted back to the computer 106. Other fields similarly may or may not be transmitted, depending upon the bit-map, yield analysis, and redundancy allocation programs running on the computer 106.

Upon receipt of the failed address information, the computer 106 preferably re-constructs a bit-map, identifying all of the failed addresses and bit locations so that a yield analysis can be performed. The computer 106 also executes a redundancy allocation algorithm which generates a fuse map for repairing the failed addresses and/or bit locations, using conventional laser repair or bypass fuse techniques.

Those skilled in the art will also recognize that functionality within the communication module 116 can be selectively re-distributed, in whole or in part, from the BIST module 114 to either the computer 106 or the test board 104, so that silicon resources on the chip 102 may be conserved.

While one or more embodiments of the present invention have been described, those skilled in the art will recognize that various modifications may be made. Variations upon and modifications to these embodiments are provided by the present invention, which is limited only by the following claims.

What is claimed is:

1. A method for chip testing, comprising the steps of:
    establishing a communications link between a chip and a computer tester;
    receiving on the chip an initial test algorithm over a communications link;
    testing the chip, using a built-in self-test circuit (BIST) on the chip, in accordance with the initial test algorithm;
    collecting a set of failure information in response to the testing;
    transmitting the failure information front the chip to the computer over the communications link; and
    minimizing data transmitted from the chip to the computer by comparing failed data patterns in a buffer on the chip, with previous failed data patterns.

2. The method of claim 1, wherein:
    the receiving step includes the step of receiving a second test algorithm whose coverage differs from the initial rest algorithm; and
    the testing step includes the step of testing the chip in accordance with the second test algorithm.

3. The method of claim 1, wherein the testing step includes the step of:
    testing a memory array within the chip in accordance with the algorithm.

4. The method of claim 3 further comprising the step of:
    generating a bit-map on the computer, from the failure information, of failed bit locations within the memory array.

5. The method of claim 3 wherein the collecting step includes the step of:
    collecting a set of failed address information in response to the testing.

6. The method of claim 5 wherein:
    the testing step includes the steps of,
    writing a set of data to an address under test in the memory array reading out data from the address; and
    the collecting step includes the step of adding the address under test to the set of failed address information, if the written set of data is not equivalent to the set of data read-out.

7. The method of claim 6 wherein the collecting step includes the step of:
    adding bit locations in the address under test, in which the written set of data differs from the set of data read-out, to the set of failed address information.

8. The method of claim 1, further including the step of:
    repairing the chip using redundancy allocation techniques based on the set of failure information.

9. The method of claim 1 further comprising the steps of:
    identifying a number of circuit redundancies within the chip; and
    halting testing if the failure information exceeds the number of redundancies.

10. The method of claim 1 wherein collecting a set of failure information further comprises temporarily storing the failure information to a buffer on the chip.

11. The method of claim 1 wherein transmitting the failure information further comprises transmitting the failure information from a communication module on the chip to the computer over the communication link.

12. The method of claim 1 wherein the chip and computer exchange messages over a serial bus protocol.

13. The method of claim 1 wherein the computer tester is a personal computer.

14. A method for chip testing, comprising the steps of:
    establishing a communications link between a chip and a computer tester;
    receiving on the chip an initial test algorithm over a communications link;
    testing a memory array within the chip, using a built-in self-test circuit (BIST) on the chip, in accordance with the initial test algorithm;
    adding an address under test and those bit locations which failed to a set of failed address information, if a set of data written to the address under test is not equivalent to a set of data read-out from the address under test;
    transmitting the failed address information from the chip to the computer over the communications link;
    minimizing data transmitted from the chip to the computer by comparing failed data patterns in a buffer on the chip with previous failed data patterns; and
    generating a bit-map on the computer, from the failed address information, of the failed bit locations within the memory array.

15. A computer-usable medium embodying computer program code for commanding a computer to perform chip testing comprising the steps of:
    establishing a communications link between a chip and a computer tester;
    receiving on the chip an initial test algorithm over a communications link;
    testing the chip, using a built-in self-test circuit (BIST) on the chip, in accordance with the initial test algorithm;
    collecting a set of failure information in response to the testing;
    transmitting the failure information from the chip to the computer over the communications link; and
    minimizing data transmitted from the chip to the computer by comparing failed data patterns in a buffer on the chip with previous failed data patterns.

16. The medium of claim 15, wherein the testing step includes the step of:

testing a memory array within the chip in according with the algorithm.

17. The medium of claim 16 further comprising the step of:

generating a bit-map on the computer, from the failure information, of failed bit locations within the memory array.

18. The medium of claim 16 wherein the collecting step includes the step of:

collecting a set of failed address information in response to the testing.

19. The medium of claim 18 wherein:

the testing step includes the steps of, writing a set of data to an address under test in the memory array reading out data from the address; and the collecting step includes the step of adding the address under test to the set of failed address information, if the written set of data is not equivalent to the set of data read-out.

20. The medium of claim 19 the collecting step includes the step of:

adding bit locations in the address under test, in which the written set of data differs from the set of data read-out, to the set of failed address information.

21. The medium of claim 15, further including the steps of:

repairing the chip using redundancy allocation techniques based on the set of failure information.

22. The medium of claim 15 wherein collecting a set of failure information further comprises temporarily storing the failure information to a buffer on the chip.

23. The medium of claim 15 wherein transmitting the failure information further comprises transmitting the failure information from a communication module on the chip to the computer over the communication link.

24. A system for chip testing comprising:

means for establishing a communications link between a chip and a computer tester;

means for receiving on the chip an initial algorithm over a communications link;

means for testing the chip, using a built-in self-test circuit (BIST) on the chip, in accordance with the initial test algorithm;

means for collecting a set of failure information in response to the testing;

means for transmitting the failure information from the chip to the computer over the communications link; and means for minimizing data transmitted from the chip to the computer by comparing failed data patterns in a buffer on the chip with previous failed data patterns.

25. The system of claim 24 wherein the means for collecting a set of failure information further comprises temporarily storing the failure information to a buffer on the chip.

26. The system of claim 24 wherein the means for transmitting the failure information further comprises transmitting the failure information from a communication module on the chip to the computer over the communication link.

27. A system for chip testing, comprising:

a communications link;

a computer, operating a set of chip testing software; and a chip under test coupled to the computer by the communications link, having, a memory array; and a Built In Self Test (BIST) module for testing the memory array in response to test algorithms received from the computer and transmitting those addresses within the memory array which failed testing, wherein the BIST module further minimizes data transmitted to the computer by comparing failed data patterns in a buffer on the chip with previous failed data patterns.

28. The system of claim 27, wherein the chip includes:

redundant circuits responsive to repair programs activated on the computer in response to the address failures detected during testing.

29. The system of claim 27 wherein the computer is a personal computer.

30. The system of claim 27 wherein the computer receives, via the communication link, the addresses that failed testing and, upon receipt of the failed addresses, reconstructs a bit-map that identifies the failed addresses.

31. The system of claim 30 wherein the computer executes a redundancy allocation algorithm that generates a fuse map for repairing the failed addresses.

* * * * *